United States Patent
Jeong et al.

(10) Patent No.: US 6,755,221 B2
(45) Date of Patent: Jun. 29, 2004

(54) LOAD PORT OF A SEMICONDUCTOR MANUFACTURING APPARATUS HAVING INTEGRATED KINEMATIC COUPLING PINS AND SENSORS, AND METHOD OF LOADING WAFERS USING THE SAME

(75) Inventors: Gyu-Chan Jeong, Suwon (KR); Ki-Sang Kim, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 4 days.

(21) Appl. No.: 10/079,262

(22) Filed: Feb. 21, 2002

(65) Prior Publication Data

US 2002/0114684 A1 Aug. 22, 2002

(30) Foreign Application Priority Data

Feb. 22, 2001 (KR) .......................................... 2001-09045

(51) Int. Cl.[7] .............................................. B65B 31/00
(52) U.S. Cl. .......................................... 141/63; 206/711
(58) Field of Search ............................ 438/14; 414/221, 414/222.09; 206/711; 141/63

(56) References Cited

U.S. PATENT DOCUMENTS

| | | | | |
|---|---|---|---|---|
| 5,988,233 A | * | 11/1999 | Fosnight | 141/63 |
| 6,250,869 B1 | * | 6/2001 | Krocker | 414/221 |
| 6,398,032 B2 | * | 6/2002 | Fosnight | 206/711 |

* cited by examiner

Primary Examiner—John F. Niebling
Assistant Examiner—Andre C Stevenson
(74) Attorney, Agent, or Firm—Volentine Francos, PLLC

(57) ABSTRACT

A load port of a semiconductor manufacturing apparatus includes a plurality of kinematic coupling pins and a plurality of sensors integrated with the pins. The contacts of the sensors have upper portions that protrude from the pins. Thus, when a cassette is place on the load port, the sensors can reliably sense whether the cassette is resting properly and/or can determine whether the cassette contains wafers. Once such determinations are made in the positive, a command signal is issued that serves to load the wafers into a chamber of the manufacturing apparatus.

24 Claims, 5 Drawing Sheets

(Relation Art)

LOAD PORT OF A SEMICONDUCTOR MANUFACTURING APPARATUS HAVING INTEGRATED KINEMATIC COUPLING PINS AND SENSORS, AND METHOD OF LOADING WAFERS USING THE SAME

BACKGROUND OF THE INVENTION

1. Field of the Invention

The present invention relates to a semiconductor manufacturing apparatus. More particularly, the present invention relates to a load port of a semiconductor manufacturing apparatus.

2. Description of the Related Art

FIG. 1 illustrates a typical loading section 100 of a semiconductor manufacturing apparatus at which disk-shaped semiconductor wafers are loaded into the apparatus. The loading section 100 includes a load port (200 in FIG. 2), a mini-chamber 110 having a wafer transfer robot 112 and a door opening robot (not shown), and a load lock chamber 120. A wafer cassette 130 that stores disk-shaped wafers is safely placed by hand or by an automated material handling system (AMHS) onto the load port 200 outside the mini-chamber 110. A front opening unified pod (FOUP) is widely used as the wafer cassette 130 for wafers that are 300 mm in diameter.

Subsequently, the door opening robot of the mini-chamber 110 opens a door 132 of the wafer cassette 130. Then the wafer transfer robot 112 transfers the wafers stacked in the cassette 130 into the load lock chamber 110. The wafers are transferred from the load lock chamber 120 to a process chamber (not shown).

Referring now to FIG. 2, the load port 200 onto which the FOUP 130 is placed includes a plurality of kinematic coupling pins 220 and a plurality of sensors 240 arrayed on a flat surface thereof. The FOUP 130 includes grooves (not shown) that receive the kinematic coupling pins 220 when the FOUP 130 is placed on the load port 200. The sensors 240 contact a portion of a bottom surface of the FOUP 130 to sense whether the FOUP 130 is properly resting on the load port 200.

If the sensors 240 do not sense that the FOUP 130 is positioned properly on the load port 200, a subsequent process is not executed. That is, the process in which the door opening robot opens the door 132 of the FOUP 130 and the wafer transfer robot 112 transfers wafers from the FOUP 130 into the load lock chamber 120, will not be carried out.

In the load port 200 shown in FIG. 2, the kinematic coupling pins 220 substantially contact the FOUP 130 to support it and the sensors 240 only sense whether the FOUP 130 is properly resting on the load port 200. Therefore, if a foreign object or substance lies on the sensors 240, the sensors 240 can incorrectly sense that the FOUP 130 is properly situated on the load port 200. In addition, the sensors 240 are not as tall as the kinematic coupling pins 220. Therefore, even when the FOUP 130 is resting properly on the kinematic coupling pins 220, a bottom surface of the FOUP 130 may not sufficiently contact the sensors 240. In this case, the sensor 240 will not perform properly, i.e., will not correctly sense the presence of the FOUP 130.

Still further, the load port 200 can not determine whether wafers are stored in the wafer cassette. An empty wafer cassette 130 can sometimes be erroneously transferred onto the load port 200. In this case, even though the wafer cassette 130 is properly placed on the load port 200, a subsequent process is initiated. Accordingly, a processing error occurs.

SUMMARY OF THE INVENTION

An object of the present invention is to overcome the problems described above.

More specifically, one object of the present invention is to provide a load port that can accurately sense whether a wafer cassette has been properly placed thereon in preparation for the loading of wafers into a chamber of a manufacturing apparatus.

Another object of the present invention is to provide a load port which can discriminate whether a wafer cassette placed thereon contains any semiconductor wafers.

In order to achieve the above objects, the load port of the present invention includes a support member, a plurality of kinematic coupling pins projecting upwardly from the support member, and a plurality of sensors integrated with the coupling pins.

The sensors are operable to sense for the presence of the bottom of the cassette and thereby determine whether the wafer cassette is resting properly on the load port. The contact of each sensor, except at an upper end thereof, is embedded in a respective kinematic coupling pin. The upper end of the sensor protrudes from the kinematic coupling pin. Preferably, at least three kinematic coupling pins and corresponding sensors are arrayed on the support member so as to balance a wafer cassette that is placed properly thereon. The sensors may be photo sensors or on-off sensors (switches). Alternatively, the sensors may be weight-detecting sensors that make use of piezoelectric elements. The wafer cassette has grooves in the bottom surface thereof, and the grooves receive the kinematic coupling pins and the sensors when the wafer cassette properly rests on the load port.

According to the present invention, it is possible to accurately sense whether the wafer cassette is situated properly on the support member of the load port and/or to discriminate whether the wafer cassette contains any wafers, because the sensors are integrate with the kinematic coupling pins which support the cassette directly. Thus, the reliability of the semiconductor manufacturing process is enhanced.

Another object of the present invention is to provide a method of loading wafers into a chamber of a semiconductor apparatus that prevents processing errors from occurring.

To achieve this object, the method of the present invention entails detecting for the presence of the bottom of the cassette at a plurality of sites located on the upper surface of the support member, and measuring the load exerted by the cassette. If the bottom of the cassette is detected as being present at each of the detection sites, then the cassette is determined to be resting properly for the transfer of wafers therefrom. And, if the load exceeds a predetermined value corresponding to the weight of a cassette, then it is determined that the cassette contains a wafer(s). A control signal is issued to initiate the manufacturing process only once these conditions are established is. In particular, the door of the cassette is opened, and a robot is commanded to transfer wafers from the cassette into a chamber of the manufacturing apparatus.

The manufacturing process is thus never initiated when the cassette is situated improperly on the load port or not at all, and/or when the cassette is situated properly but does not contain wafers.

BRIEF DESCRIPTION OF THE DRAWINGS

These and other objects, features and advantages of the present invention will be better understood from the following detailed description of the preferred embodiment thereof made with reference to the accompanying drawings, of which.

DETAILED DESCRIPTION OF THE PREFERRED EMBODIMENTS

Figure 3:
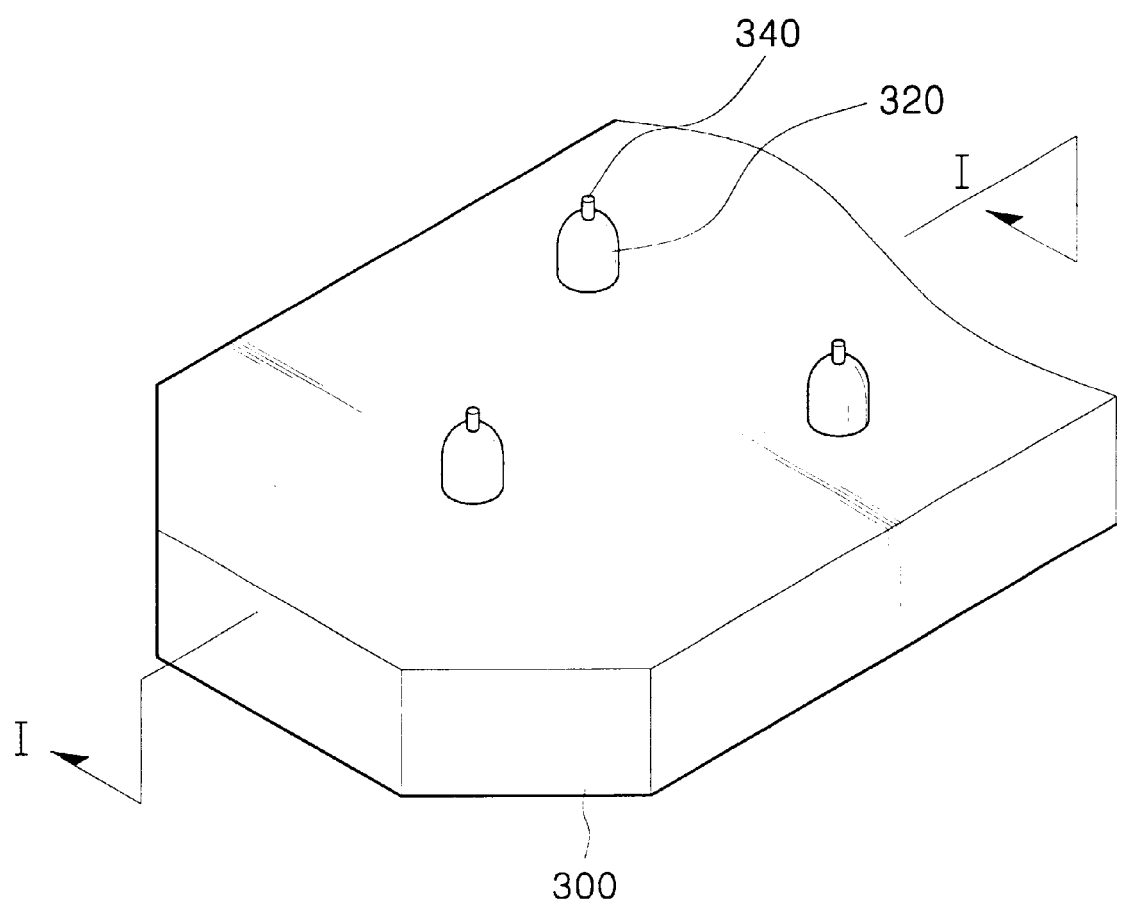
FIG. 3 is a perspective view of a load port of a semiconductor manufacturing apparatus according to the present invention.
Figure 4:
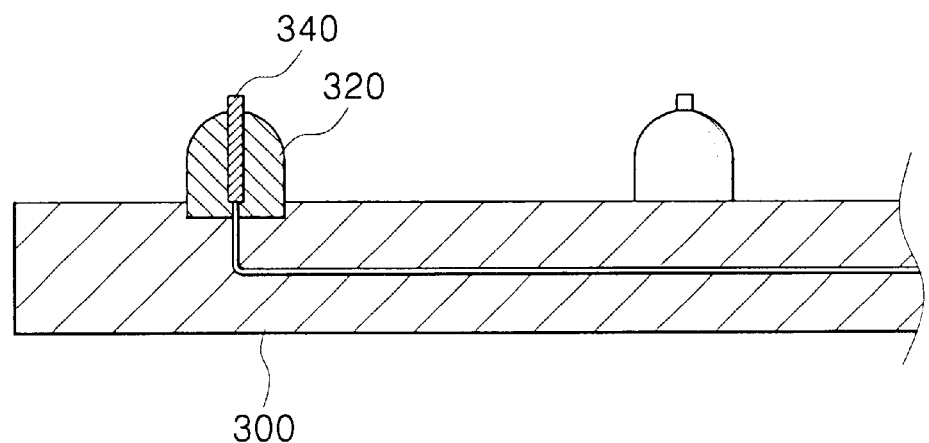
FIG. 4 is a sectional view of the load port of FIG. 3 taken along line I—I of FIG. 3.

The present invention will now be described in more detail referring to FIGS. 3 and 4.

Figure 1:
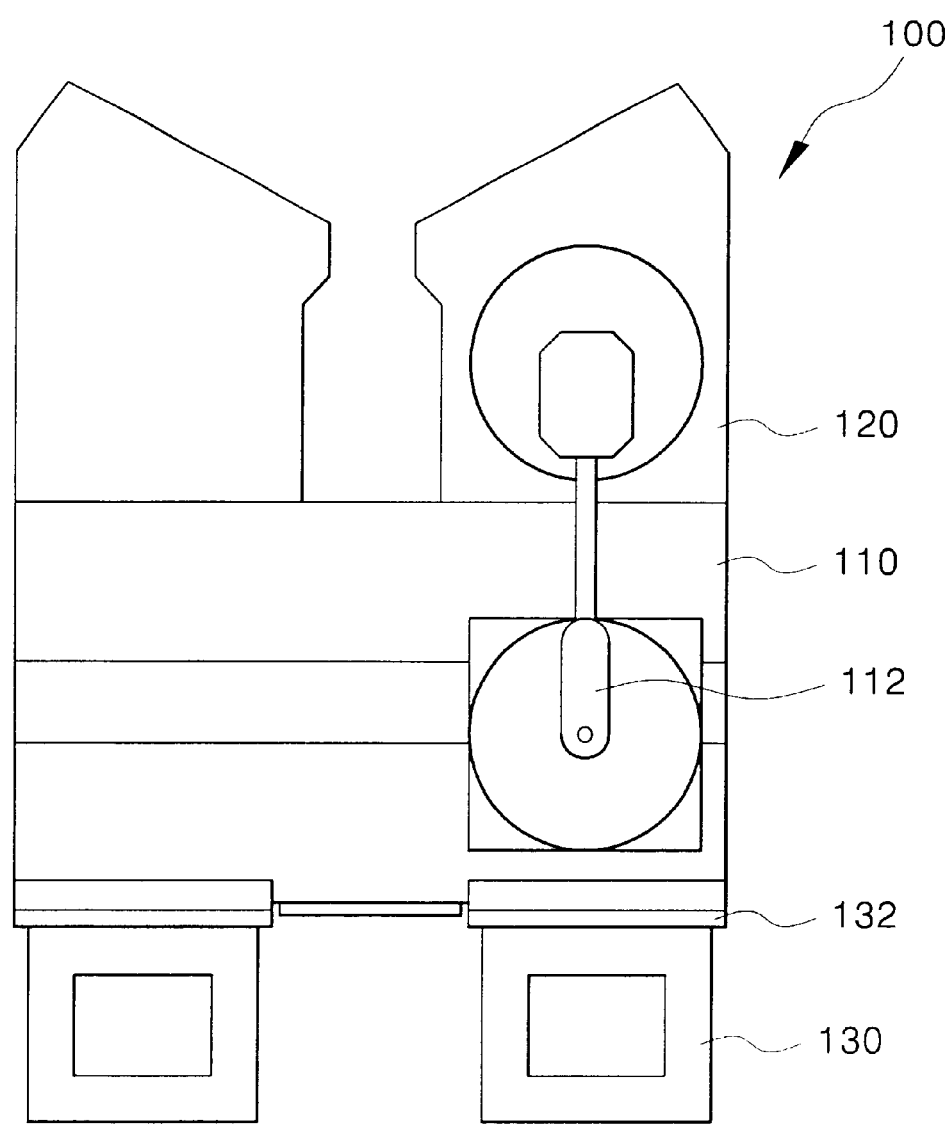
FIG. 1 is a schematic plan view of a loading section of a semiconductor manufacturing apparatus.
Figure 2:
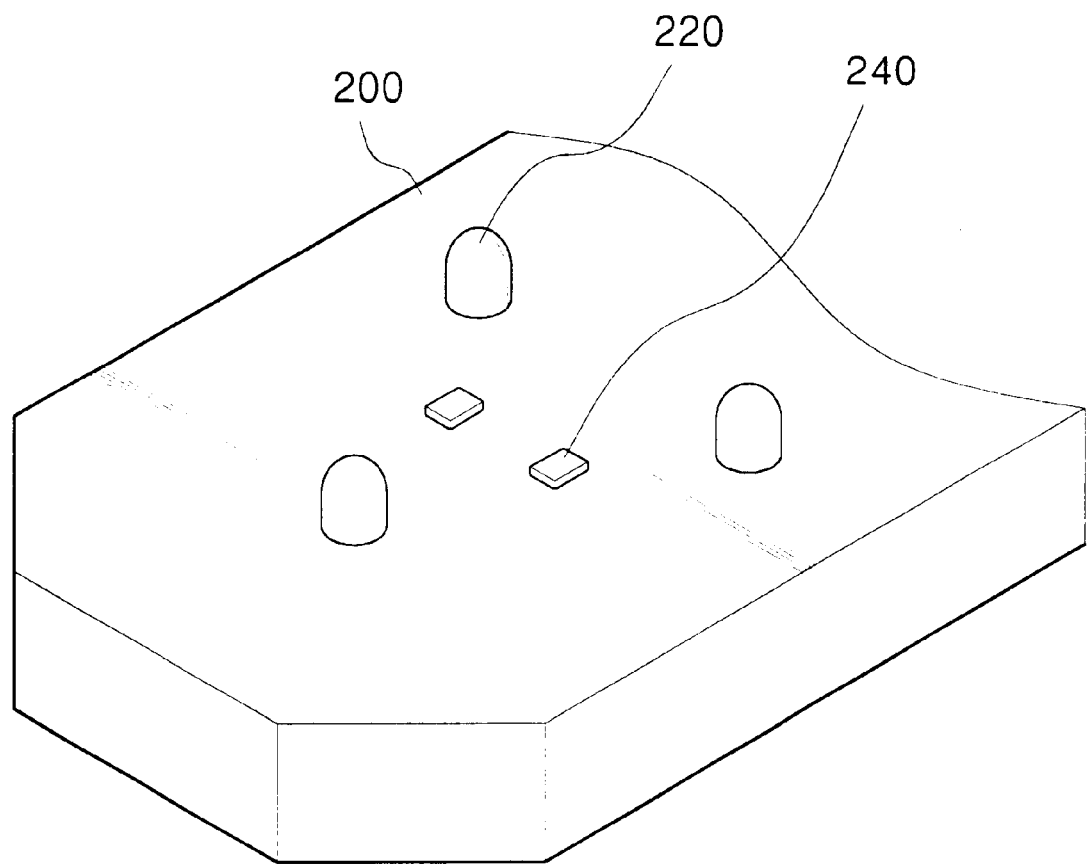
FIG. 2 is a perspective view of a conventional load port of the semiconductor manufacturing apparatus.

The load port of the present invention is located outside of the mini-chamber 110 (see FIG. 1) equipped with a wafer transfer robot (112) and a door opening robot. The load port includes a support member 300 having a flat upper surface, a plurality of kinematic coupling pins 320 protruding from the upper flat surface of the support member 300, and a plurality of sensors 340. A respective sensor 340 protrudes upwardly from within each of the kinematic coupling pins 320. Preferably, at least three kinematic coupling pins 320 and the sensors 340 are provided so that the FOUP 130 can be balanced thereon in a state in which the sensors 340 reliably contact the bottom of the FOUP 130.

According to the present invention, the kinematic coupling pins 320 and the sensors 340 are integrated. The contacts of the sensors 340, except at upper end portions thereof, are embedded in the kinematic coupling pins 320, respectively. That is, the upper end portion of each sensor 340 is exposed.

Figure 5:
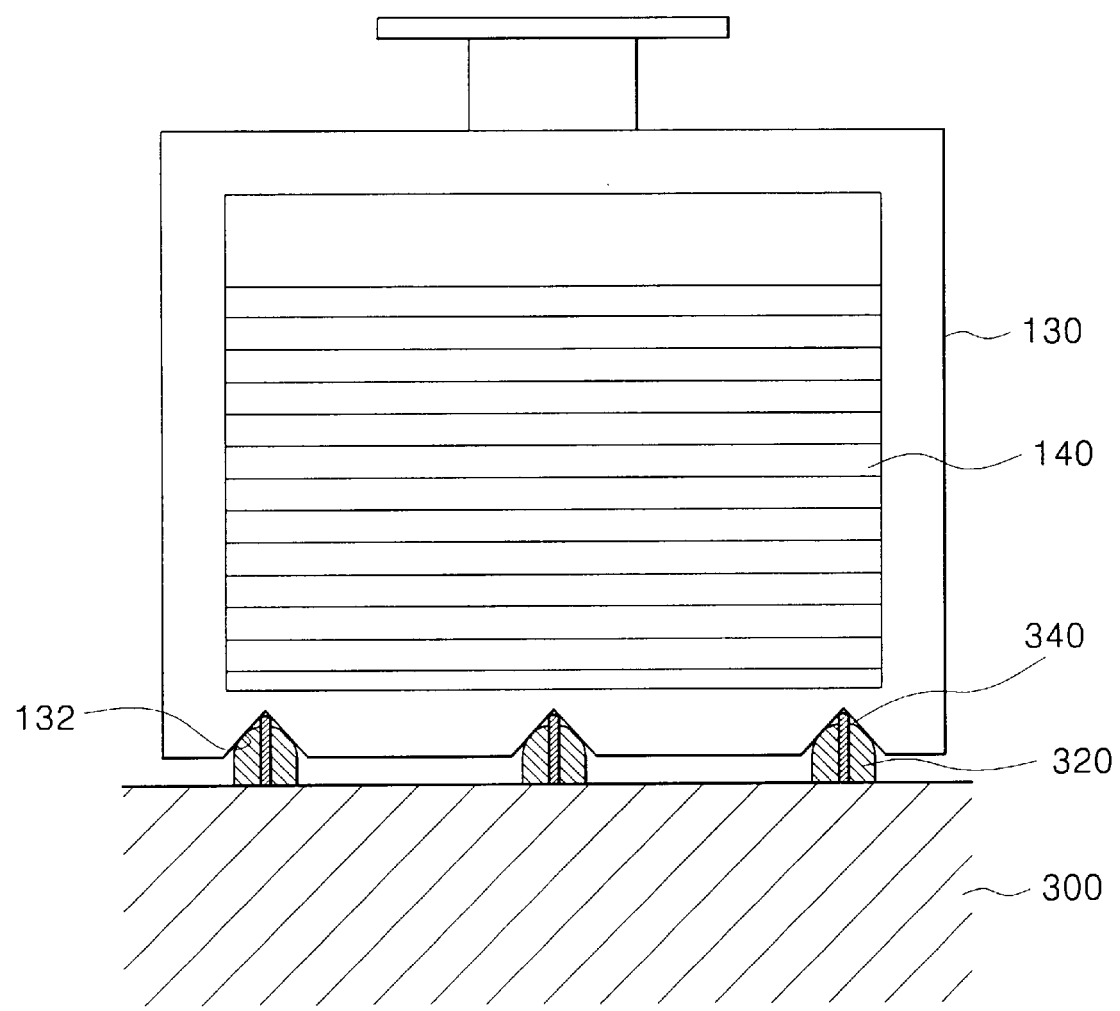
FIG. 5 is a cross-sectional view of the load port of FIG. 3 in a state in which a FOUP has been properly placed thereon.

FIG. 5 shows a FOUP that has been properly placed on the load port. The FOUP 130 includes grooves 132 that receive the kinematic coupling pins 320 and the sensors 340 when the FOUP 130 rests on the load port. The sensors 340 can sense whether the FOUP 130 is properly situated on the load port. In addition, the sensors 340 may also be of a type that can discriminate a FOUP 130 loaded with wafers from an empty FOUP 130.

To this end, the sensors 340 may comprise at least one weight-detecting sensor such as a piezoelectric sensor. For example, if three piezoelectric weight-detecting sensors 340 are used, and the sensors 340 detect different weights, the FOUP 130 is determined as not resting properly on the load port. In addition, the weight of the FOUP 130, as detected by the sensors 340, can be compared to a predetermined value to discriminate whether any wafers 140 are present in the FOUP 130. Furthermore, the number of wafers 140 stacked in the FOUP 130 can be determined from the known value of the weight of one wafer. A more accurate and efficient semiconductor manufacturing process can thus be carried out by making the above-described determinations in advance.

Alternatively, the sensors 340 may comprise photo sensors or on-off switches. In these cases, the sensors 340 can only sense whether the FOUP is properly resting on the load port. In any case, the present invention is not limited to any particular type of sensor 340. Any type of sensor that can be integrated with the kinematic coupling pin and can at least detect whether the FOUP is resting thereon may be used.

The operation of the loading section of a semiconductor manufacturing apparatus, comprising a load port according to the present invention, will now be described in detail.

The FOUP 130 is transferred to the support member 300 of the load port by an operator or an AMHS. Subsequently, the sensors 340 detect whether the FOUP 130 has been placed properly on the load port by sensing for the presence of the bottom of the FOUP 130 at each site of the integrated pin/sensor or by sensing whether the weight (load) of the FOUP 130 is equally distributed among the sensors 340. The sensors 340 may also detect whether any wafers are stored in the FOUP 130 by measuring the load exerted by the FOUP 130 at the sites of the integrated pins/sensors and comparing the total load to a predetermined value corresponding to the weight of the FOUP 130. Likewise, the number of wafers in the FOUP 130 can be determined if the weight of each wafer is known.

A control signal is issued once the cassette is determined to be situated properly at the load port (balanced on the pins 320), and is determined to contain wafers. As a result of the issuing of theses command signals, the door opening robot (not shown) opens a front door of the FOUP 130, and the wafer transfer robot (112 in FIG. 1) transfers wafers 140 from the FOUP 130 into the load-lock chamber (120 in FIG. 1). The wafers 140 transferred to the load lock chamber 120 are transferred then to another chamber, e.g., a process chamber, by another robot.

However, if all of the sensors 340 do not contact the bottom surface of the FOUP 130 sufficiently, the FOUP 130 is determined as not having been properly placed on the load port. Accordingly, the semiconductor manufacturing process does not proceed until the FOUP 130 is properly placed on the load port 300. Also, if the FOUP 130 does not contain any wafers even though it is sensed as resting properly on the support member 300 of the load port, a semiconductor manufacturing process does not proceed.

As described above, whether a wafer cassette has been properly placed on the load port and/or whether the wafer cassette contains wafers can be accurately determined by the present invention because the kinematic coupling pins and the sensors are integral. Accordingly, the present invention enhances the reliability of the semiconductor manufacturing process.

Finally, although the present invention has been shown and described with reference to the preferred embodiments thereof, various changes in form and details, as will become apparent to those of ordinary skill in the art, may be made thereto without departing from the true spirit and scope of the invention as defined by the appended claims.

What is claimed is:

1. A load port of a semiconductor manufacturing apparatus, comprising: a support member having an upper surface, a plurality of kinematic coupling pins protruding from the upper surface of said support member and arrayed to support a wafer cassette loaded onto the support member, and a plurality of sensors that are integrated with said kinematic coupling pins, respectively, such that said sensors are actuated only when a load is exerted on said coupling pins, wherein the sensors will be actuated when a wafer cassette supported by the kinematic coupling pins exerts said load on the coupling pins but not when the load is exerted on any part of the upper surface of said support member without being exerted on said coupling pins.

2. The load port of claim 1, wherein the sensors are operable to sense whether a wafer cassette is resting atop of said kinematic coupling pins.

3. The load port of claim 1, wherein said sensors have contacts that are embedded in said kinematic coupling pins, respectively, said contacts each having an upper portions exposed at the top of one of said pins.

4. The load port of claim 1, comprising at least three of said kinematic coupling pins and sensors integrated therewith.

5. The load port of claim 1, wherein said sensors comprise a photo sensor or an on-off switch.

6. The load port of claim 1, wherein said sensors comprise a weight detector operable to detect a load exerted thereon.

7. The load port of claim 6, wherein said weight detector comprises a piezoelectric element.

8. A loading section of a semiconductor manufacturing apparatus, comprising: a mini-chamber equipped with a robot, a load-lock chamber connected to said mini-chamber, and a load port disposed outside said mini-chamber, said load port including a support member having an upper surface, a plurality of kinematic coupling pins protruding from the upper surface of said support member and arrayed to support a wafer cassette loaded onto the support member, and a plurality of sensors that are integrated with said kinematic coupling pins, respectively, such that said sensors are actuated only when a load is exerted on said coupling pins, wherein the sensors will be actuated when a wafer cassette supported by the kinematic coupling pins exerts said load on the coupling pins but not when the load is exerted on any part of the upper surface of said support member without being exerted on said coupling pins.

9. The loading section of a semiconductor manufacturing apparatus as claimed in claim 8, wherein the sensors of said load port are operable to sense whether a wafer cassette is resting on said kinematic coupling pins.

10. The loading section of a semiconductor manufacturing apparatus as claimed in claim 8, wherein said sensors of the load port have contacts that are embedded in said kinematic coupling pins, respectively, said contacts having upper portions that are exposed at the top of said pins.

11. The loading section of a semiconductor manufacturing apparatus as claimed in claim 8, wherein said load port comprises at least three of said kinematic coupling pins and integrated sensors.

12. The loading section of a semiconductor manufacturing apparatus as claimed in claim 8, wherein said sensors of the load port comprise a photo sensor or an on-off switch.

13. The loading section of a semiconductor manufacturing apparatus as claimed in claim 8, wherein said sensors of the load port comprise a weight detector operable to detect a load exerted thereon.

14. The loading section of a semiconductor manufacturing apparatus as claimed in claim 13, wherein said weight detect or comprises a piezoelectric element.

15. The load port of claim 1, wherein said sensors have actuatable portions that are located above the upper surface of said support member.

16. The loading section of a semiconductor manufacturing apparatus as claimed in claim 8, wherein said sensors have actuatable portions that are located above the upper surface of said support member.

17. The combination of a wafer cassette and a load port of a semiconductor manufacturing apparatus, wherein said load port comprises a support member having an upper surface, a plurality of kinematic coupling pins protruding from the upper surface of said support member and arrayed to support said wafer cassette when the cassette is loaded onto the support member, and a plurality of sensors that are integrated with said kinematic coupling pins, respectively, such that said sensors are actuated only when a load is exerted on said coupling pins, wherein the sensors will be actuated when a wafer cassette supported by the kinematic coupling pins exerts said load on the coupling pins but not when the load is exerted on any part of the upper surface of said support member without being exerted on said coupling pins.

18. The combination of claim 17, wherein said sensors of the load part have actuatable portions that are located above the upper surface of said support member.

19. The combination of claim 17, wherein said sensors of the load port have contacts that are embedded in said kinematic coupling pins, respectively, said contacts each having an upper portions exposed at the top of one of said pins.

20. The combination of claim 17, wherein said load port comprises at least three of said kinematic coupling pins and sensors integrated therewith.

21. The combination of claim 17, wherein said sensors of the load port comprise a photo sensor or an on-off switch.

22. The combination of claim 17, wherein said sensors of the load port comprise a weight detector operable to detect a load exerted thereon.

23. The combination of claim 22, wherein said weight detector comprises a piezoelectric element.

24. The combination of claim 17, wherein said wafer cassette comprises a wall having an outer surface, and a plurality of grooves in said outer surface, the grooves being arrayed in correspondence with said kinematic coupling pins, wherein said pins are received in said grooves, respectively, when said cassette is properly positioned on said load port.

* * * * *